United States Patent
Caputo et al.

(10) Patent No.: US 6,169,284 B1
(45) Date of Patent: Jan. 2, 2001

(54) SYSTEM OF INFRARED RADIATION DETECTION BASED ON SENSORS OF AMORPHOUS SILICON AND ITS ALLOYS

(75) Inventors: Domenico Caputo, Patrica; Fabrizio Palma, Rome, both of (IT)

(73) Assignee: Universita Degli Sudi di Roma "La Sapienza", Rome (IT)

( * ) Notice: Under 35 U.S.C. 154(b), the term of this patent shall be extended for 0 days.

(21) Appl. No.: 09/088,302

(22) Filed: Jun. 1, 1998

(30) Foreign Application Priority Data

Jun. 6, 1997 (IT) .............................. RM97A0341

(51) Int. Cl.$^7$ ...................................................... H01L 31/11
(52) U.S. Cl. ................................... 250/338.4; 250/370.01
(58) Field of Search ............................. 250/338.4, 370.01

(56) References Cited

U.S. PATENT DOCUMENTS 5,682,037 * 10/1997 de Cesare et al. .............. 250/370.01

FOREIGN PATENT DOCUMENTS 0682375  11/1995  (EP) .
0726605   8/1996  (EP) .

OTHER PUBLICATIONS

Cesare et al., "Variable Spectral Response", J. of Non–Crystalline Solids, May 1996, pp. 1189–1192.

Okamura et al., "Infrared Photodetection", IEEE Photonics Technology, May 1994, pp. 412–414.

Caputo et al., "Characterization . . . ", Journal of Applied Physics, Sep. 1994, pp. 3534–3541.

* cited by examiner

*Primary Examiner*—Constantine Hannaher
*Assistant Examiner*—Andrew Israel
(74) *Attorney, Agent, or Firm*—Harrison & Egbert

(57) ABSTRACT

A system for the detection of infrared light (IR with wavelength $\lambda > 800$ nm) of high sensitivity. It is based on the measurement of the capacitance in structures made of amorphous silicon, constituted of a junction having two electrodes connecting to outside and susceptible of being built using already-known technologies for the deposition of thin films. The p$^+$ and n$^+$ layers (FIG. 1) are made of materials strongly doped with boron and phosphorous atoms. During the fabrication process the temperatures are such as to permit its construction on various substrates. The technologies used make its fabrication possible on large areas and its conformation in two-dimensional matrices of high resolution.

5 Claims, 6 Drawing Sheets

SYSTEM OF INFRARED RADIATION DETECTION BASED ON SENSORS OF AMORPHOUS SILICON AND ITS ALLOYS

TECHNICAL FIELD

This invention concerns a system that enables the detection of infrared light (IR, with wavelength $\lambda > 800$ nm) having high sensitivity and high rejection of light of shorter wavelength.

BACKGROUND ART

The system presented is based in particular on the measurement of the capacitance in structures made of amorphous silicon, constituted by a $p^+$-i-$n^+$ junction, having two electrodes connecting with the outside and susceptible of being built with already-known technologies for thin film deposition. The layers indicated with $p^+$ and $n^+$ are made of materials strongly doped with boron and phosphorous atoms respectively, while the i layer indicates the layer lying between the two.

The temperatures during the entire fabrication process are such as to enable the structure's deposit on various substrates, such as glass, plastic, metal. The technologies used enable it to be fabricated over on a large area and also admit a high-resolution two-dimensional matrix conformation.

One fundamental element of the invention concerns the special characteristics required over the intermediate layer (i), indicated by 1 on the drawings, which is the site of numerous electronic defects of a particular type, owing to which electron transitions can be excited that give rise to the detection of infrared radiation (IR).

The subject invention can be used:

to detect phenomena accompanied by the emission of heat, for example in temperature control, or in the making of thermal maps, or in the taking of night images;

for instrumentation used in remote temperature control, or in the fields of chemistry, physics or biology;

for infrared spectroscopy.

The physical phenomena that take place in the detection of infrared radiation by the amorphous silicon structure are intrinsically faster than those taking place in the detection of visible radiation, so that the system in question lends itself as well to performing the function of detection of infrared radiation conducted by optical fibers in optical telecommunications systems. In this particular case the low cost of its construction and the ability of being deposited directly on the optical system make it highly competitive with currently existing detectors.

The invention may be used in the construction of:

fire-detection systems (its rejection of visible light means it can be used even in full daylight);

systems for thermally mapping machinery, and therefore control and alarm systems;

high-resolution IR image matrix detection systems;

signal detection systems on IR optical carriers.

The invention's focal point lies in the ability to absorb infrared radiation by transition between the extended band and semiconductor defects in a particular portion of the structure adopted in the invention. To this purpose, the type of defects that are induced by a suitable deposition technique in the semiconductor of the intermediate layer, i, is fundamental. These defects in fact must have the characteristic of being traps for the majority carriers, while not acting as centers of recombination. In this way, the IR radiation can be absorbed by a transition induced between the extended band and the defect. The number of defects per unit volume is however extremely low in comparison with the number of atoms of material, so that even in a material that has been purposely made with defects the absorption rate remains relatively low when compared with the absorption due to the transition between the two extended bands. In this case what is crucial is the nature of the trap-type defects, in order that photogenerated charge can be accumulated, and the absorption effect be multiplied.

Under these conditions the absorption of IR light dramatically changes the structure capacitance and it is this that makes possible the outside detection. It is in the detection method that provide a second major benefit of the present invention. This benefit occurs because presence of IR radiation can be detected by the measurement of the capacitance at the terminals where the incident radiation is constant or slowly varying, or else by the measurement of the photo-capacitance charging and discharging current where there are rapid changes in radiation intensity.

In this invention radiation detection is made possible by the following measures:

the frontal electrode is a metal grid that offers open areas to the incident light, through which the light can pass, or else it is a conducting electrode and transparent to IR radiation;

the doped frontal layer is thin enough not to appreciably absorb the IR radiation;

the presence of trap-type defects enables the absorption of an IR photon by the excitation of an electron. In the preferred embodiment of the present invention, the structure is so formed that this transition is principally formed by the excitation of electrons going from the valence band towards the traps. It is a fact that crystal defects are defined as alterations of the bond configuration that is periodically repeated in the crystal. In semiconductors—and in the rest of this description—in particular the term "defect" is used to define those alterations to which corresponds a local electron state whose energy lies within the forbidden gap, and is therefore able to change its own state of charge by trapping an electron or a hole, depending on the type of defect. Differing alterations of the configurations give rise to differing types of defects, characterized by different energies and different capture sections. The presence of trap-type defects, with low probabilities of transition toward the farther extended band strongly reduces recombination, giving rise to a high accumulation of charge. The structure shows a substantial difference in capacitance with or without the accumulated charge owing to the absorbtion of radiation. To this purpose the material of the intermediate layer i, of the p-i-n structure is made up of material having the following properties: a) it must contain holes prevalently, and b) it must be made with trap-type defects. This material may be made up either of a weakly doped amorphous silicon of type p, or of an amorphous silicon containing dopant of both types, in extremely low concentrations and for this reason called microcompensated.

At present there are on the market a number of infrared radiation detectors that are fundamentally based on two phenomena:

a) bolometers and pyroelectrics having microstructures that, when illuminated by radiation, change temperature. In bolometers the change in temperatures corresponds to a change in electrical resistance, which can be measured. In the pyroelectric detectors the change in temperature corresponds to a change in the electrical dipole moment of the crystal structure, and this gives rise to a measurable charge outside the crystal, through capacitative coupling;

b) the absorption of photons by the generation of electron-hole pairs, detected through photocurrent at the junctions or through changes in resistivity of photoresistances.

Whether in the bolometers or in the pyroelectric detectors, the absorption does not need the generation of carriers and therefore the absorption bands are very much extended but the heat capacity of the component can dramatically reduce the detection speed.

In the second case the junction detectors display a higher response speed since the photogenerated charges are swept by the electric field and rapidly gathered up by the outside electrodes. The photoresistances display a high optical gain, defined as the ratio between current under lighted conditions and current under dark conditions, but they are on the other hand extremely slow, since the photogenerated charges, once the radiation has ceased, cannot be removed by the presence of an electric field but disappear only owing by the effect of recombination.

In ordinary photodetectors the transition between valence band and conduction band demands a photon energy higher than or equal to the semiconductor's forbidden energy gap. For the construction of IR radiation photodetectors special low-gap semiconductor materials have been developed, such as Hg—Cd—Te, Pb—Sn—Te, In—Sb and In—As. The technology of these materials is extremely complex and the crystals obtained are of extremely small size. The costs involved are quite high. As against this the hydrogenated amorphous silicon technology on which this invention is based has had a considerable development for such applications as solar cells, and therefore by its origin is usable for applications in a large area. It also has extremely low costs, and does not present any special technological problems to be solved. Unfortunately hydrogenated amorphous silicon has a gap of 1.7 eV, which permits the detection of light only in the visible band, but limits absorption in the IR band. This energy can be reduced by adding a small percentage of germanium and forming a silicon-germanium alloy, but the characteristics of the material degenerate rapidly, so that the photogenerated electron-hole pairs do not succeed in being detected.

The difficulty in building IR light detectors of amorphous silicon can be deduced from the scarcity of results seen in the technical literature. A detector built of amorphous silicon has been presented, but it is based on the effect of the cascade multiplication of the photogenerated carriers. This component works at strong inverse voltages, with the consequent risk of increase in noise; but despite this, it has an extremely low efficiency.

SUMMARY OF THE INVENTION

The present invention overcomes the problem of the limitation due to the high gap by exploiting the absorption between extended band and localized defects. The importance of the invention lies then in its opening up new applications to a low-cost and time-tested technology like that of hydrogenated amorphous silicon.

The present invention displays characteristics that lie between those of the two systems described under a) and b):

it requires no appreciable change in the temperature of the structure and therefore it is not slowed down by the heat capacity;

its sensitivity spectrum is not limited by the semiconductor gap since it exploits the transitions between extended band and defects;

its detection times are short, since the charges needed for transition are present in the extended band in large number, as majority carriers, and since the electrical field of the junction is present.

With the present invention an optimization of the thickness of the absorbing layer is also brought about. In fact a large thickness gives a significant difference in capacitance between the illuminated state and the dark state. On the other hand, the response times worsen, since a high thickness corresponds to a higher series resistance, which the carriers must cross in order to be introduced into the structure and extracted from it. An optimization operation was also carried out in choosing the technology for depositing the intermediate material, i. In fact, the possibility of trapping charges lies at the basis of the detection, but an excessive increase in the defects would inevitably give rise as well to recombination, thus reducing the total charge detected, and therefore the instrument's sensitivity. To this purpose, the choice of a weakly doped or of a microcompensated material is of considerable importance.

The choice to dope the intermediate layer, i, is furthermore critical to determining the absorption band since the charge accumulated in it determines the position of the Fermi level and the occupation of the states in the central portion of the structure (see FIG. 1). The occupation in turn then determines what defects are free from carriers and thus they can accept the transition of an electron from the valence band, causing the absorption of an IR photon (see FIG. 3).

Capacitance in Thin Amorphous Silicon Structures

As we have noted, the capacitance of the structure is the element basic to detection. The inventors have made numerous studies on the values that the capacitance has in thin amorphous silicon film structures, in particular on p-i-n cells, where the intermediate material, i, is to be considered "intrinsic", i.e. not doped. In these structures the capacitance depends on the value of the polarization applied to the structure, on the frequency of the test sine-wave signal and on the temperature, since most of the charge accumulated in the structure is due to carriers trapped in defect states of the intrinsic materials.

The number of electron defects in an amorphous semiconductor depends substantially on the technological processes involved in its deposition. In particular, the material called "intrinsic", without any dopant atoms and deposited at temperatures around 300° C. in the presence of hydrogen furnishes the smallest number of defects. This number runs around $10^{15}$ cm$^{-3}$. These defects produce a trapped electric charge much higher than that due to the free carriers present in the material and for this reason determine the structure's electrical state, and in particular the electric field present in it, to a greater extent than do the free carriers.

Defects in Weakly Doped and in Microcompensated Amorphous Silicon

The presence of doping atoms increases the number of electron defects in the amorphous silicon, proportionally to the number of doping impurities. In weakly doped amorphous silicon the presence of another type of defect characterized by the tendency to trap holes has been demonstrated. This type of defect is extremely abundant in microcompensated amorphous silicon, determining its behavior under illumination, and giving rise in particular to a high photoconductivity. Amorphous silicon having a low doping concentration displays a behavior lying between doped and microcompensated amorphous silicon, with reduced defects and a substantial presence of hole traps.

BRIEF DESCRIPTION OF THE DRAWINGS

The invention is now to be described on the basis of a preferred embodiment and making reference to the following attached figures:

FIG. 1a is a plan view of the semiconductor structure.

FIG. 1b is a cross section through the semiconductor structure.

DETAILED DESCRIPTION OF THE PREFERRED EMBODIMENT

Figure 1:
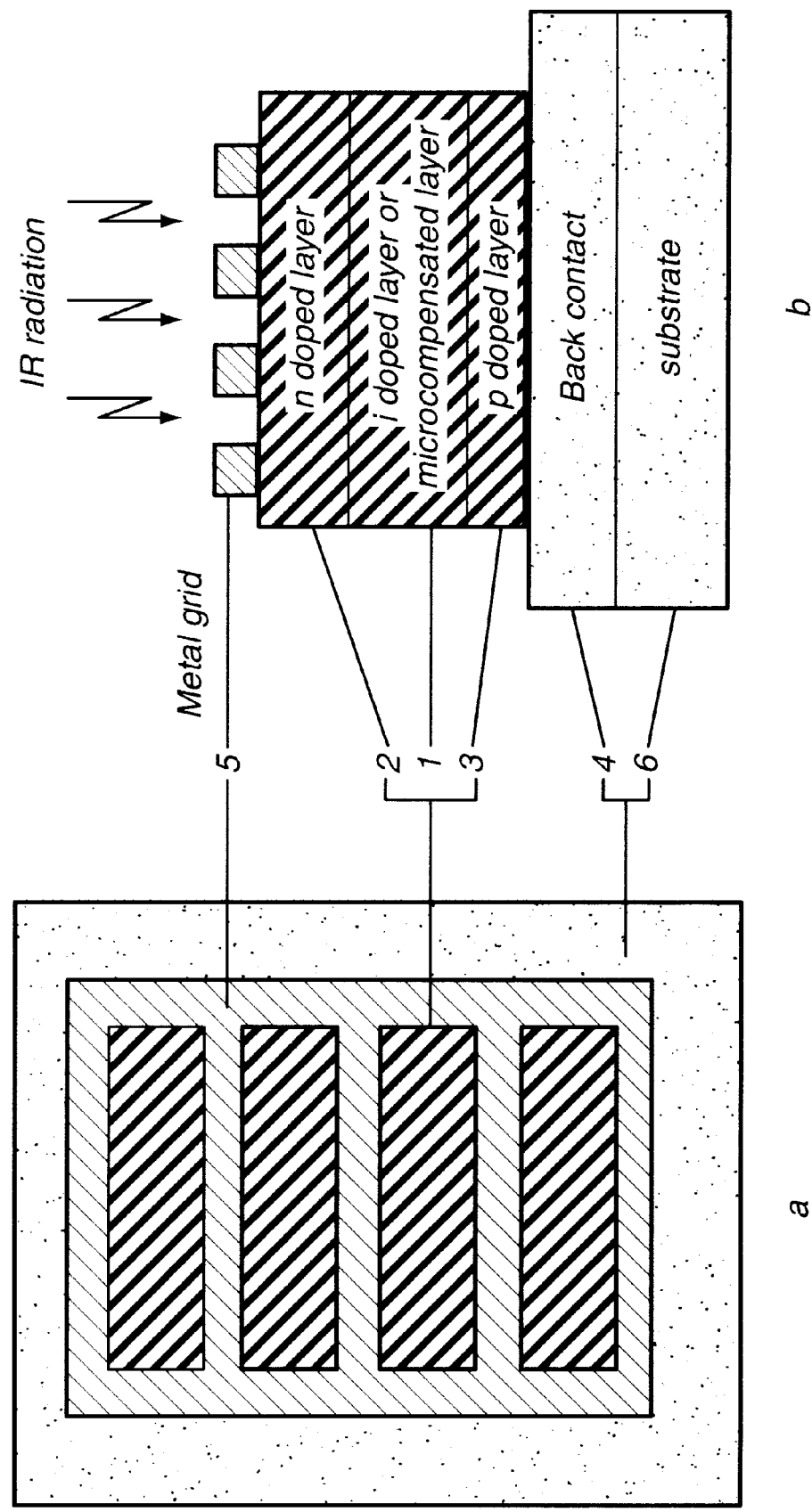
FIG. 1 shows the physical structure of the invention.

In the physical structure of the invention, shown in FIG. 1, the following are visible:

intermediate amorphous silicon layer 1 slightly doped or microcompensated, "i";

n doped layer 2;

p doped layer 3;

back contact 4;

metal grid upper contact 5; and substrate 6.

Figure 2:
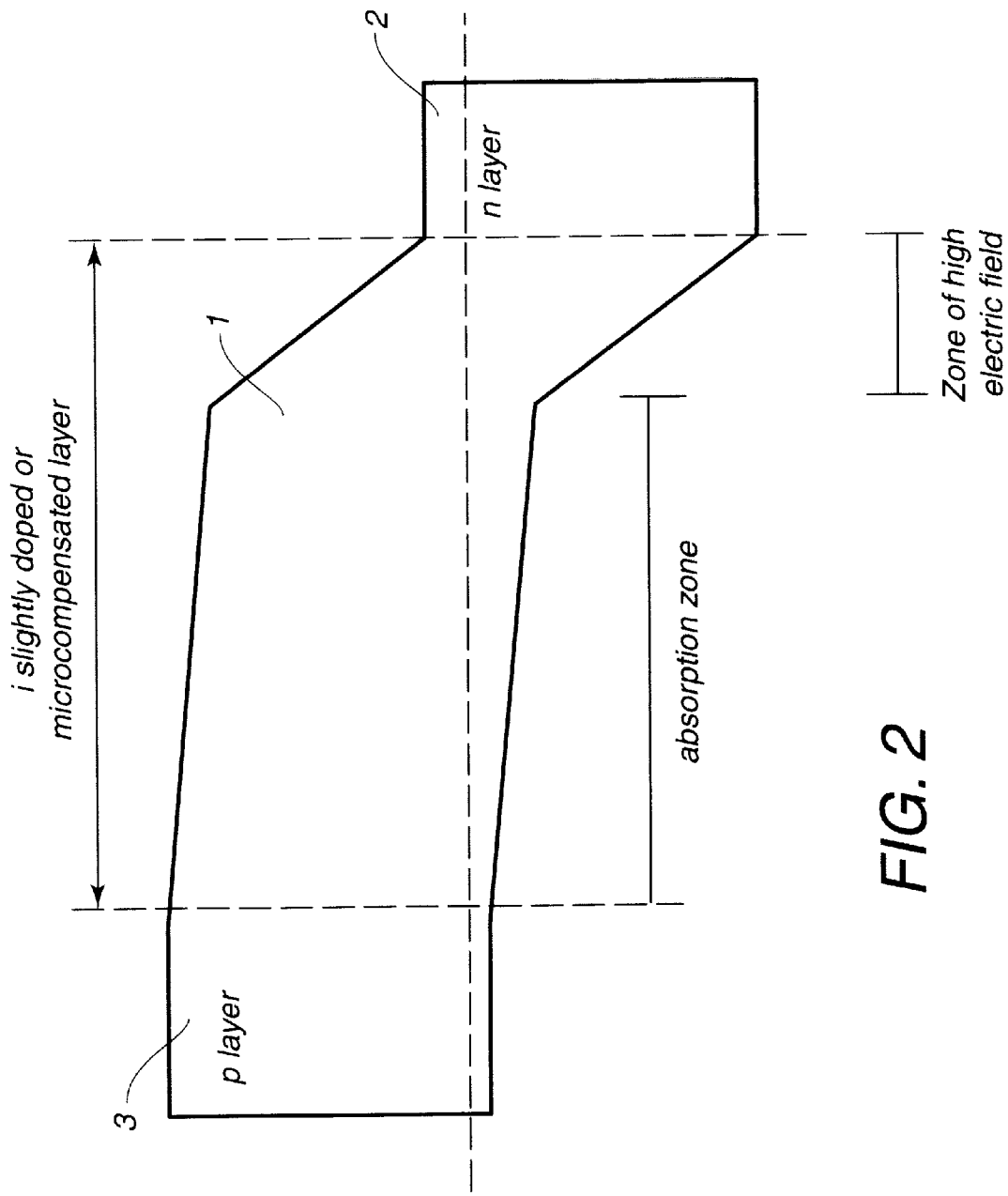
FIG. 2 is an expected-band diagram inside the structure.
Figure 4:
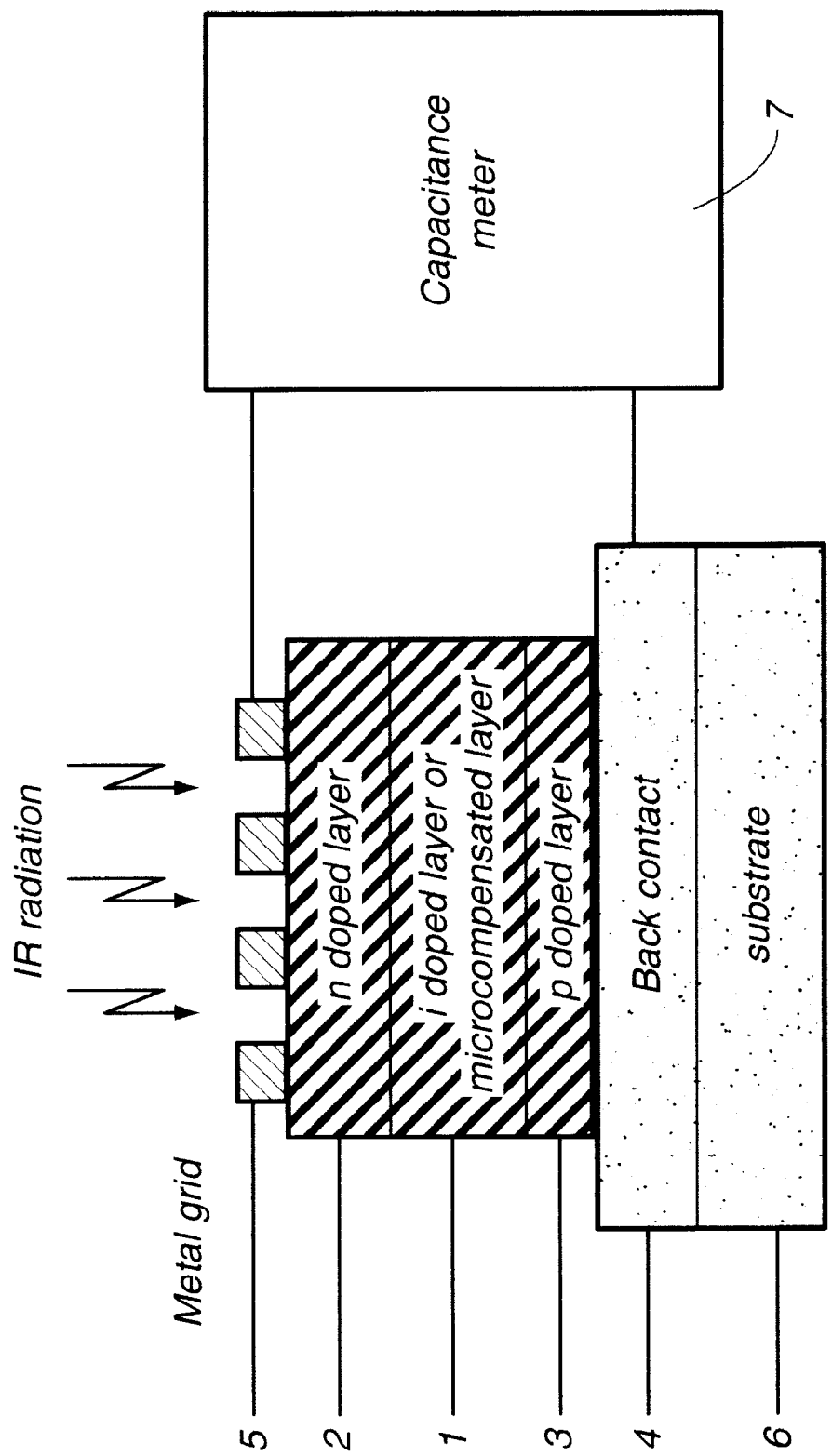
FIG. 4 shows an outside measurement circuit of the photocapacitance.

In the band diagram inside the structure shown in FIG. 2, the energy positions of the electron bands in the materials are shown; and in them are shown:

intermediate layer 1 of slightly doped or microcompensated amorphous silicon;

n doped layer 2;

p doped layer 3;

In the outside photo-capacitance measurement circuit of FIG. 4 are visible:

intermediate amorphous silicon layer 1 slightly doped or microcompensated;

doped layer n 2;

doped layer p 3;

back contact 4;

metal grid upper contact 5;

substrate 6;

capacitance meter 7.

Figure 6:
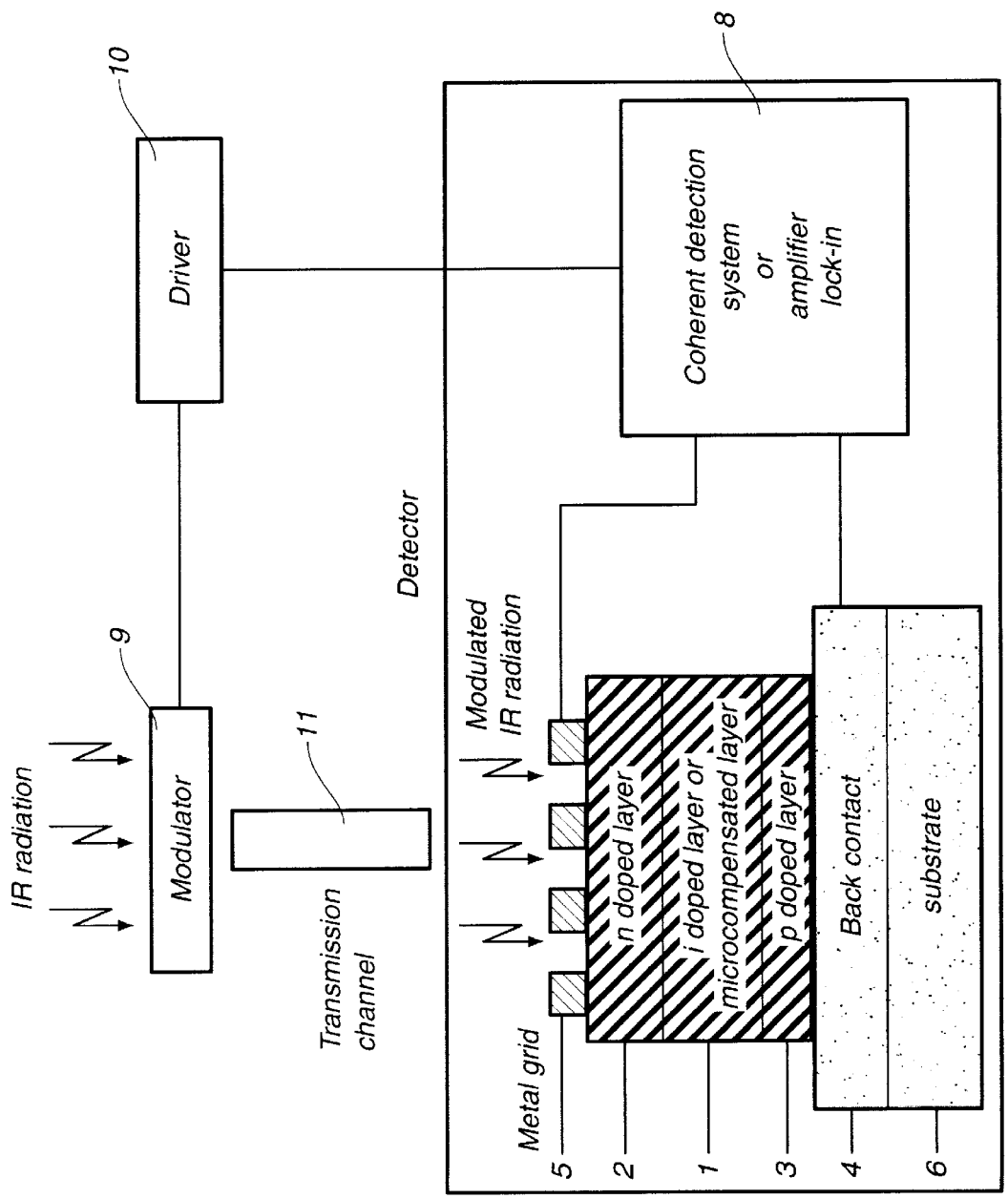
FIG. 6 is an outside measurement circuit of the current transient due to changes in the capacitance.

In the outside current transient measurement circuit of FIG. 6 are visible:

intermediate amorphous silicon layer 1 slightly doped or microcompensated;

n doped layer 2;

p doped layer 3;

back contact 4;

metal grid upper contact 5;

substrate 6;

coherent or amplifier lock-in detection system 8;

light modulator 9;

modulator driver 10 and reference signal for demodulation;

transmission channel 11.

In FIG. 1 the need for an intermediate layer between the two doped layers $p^+$ and $n^+$ of amorphous silicon is brought out, in order to form the rectifying junction. This intermediate layer must not be excessively defective, otherwise the through the defects will mask the presence of the junction. It can therefore be composed of a weakly doped material, for example $p^-$. In the preferred embodiment this doping can be from 100 to 1000 parts per million, in percentage of gas during discharge. As an alternative, a material can be used in which both phosphorous and boron are present in extremely low concentrations, but such as to balance the charge between themselves. The intrinsic material thus obtained is called microcompensated. In the preferred embodiment, this doping can range from 0.1 to 100 ppm, in percentage of gas during discharge. This last-named material is preferred since, relative to weakly doped materials it has displayed a higher density of defects of the hole-trap type and a lower density of recombining defects. Regarding FIG. 1b, it must be kept in mind that the actual dimensions of the layers will be discussed in qualitative fashion herein. In the drawing the ratios between the dimensions are not held to for graphics reasons. In the preferred embodiment the doped layer $n^+$ is 200 Å thick, while the doped layer $p^+$ is 150 Å thick. The dimensions of these layers can be varied according to need.

On observing FIG. 1a it is noted that the light radiation penetrates into the amorphous device through the open meshes of the grid and serially crosses the layers (FIG. 1b): $n^+$, intermediate (microcompensated or $p^-$), and $p^+$. The order of the different layers can be inverted in the sense that the first layer crossed could be $p^+$, then the intermediate layer (microcompensated or doped $n^-$) and finally $n^+$.

The metal grid in the figure, which forms the upper contact, can be built also from a layer of conducting oxide transparent to IR radiation. Or again, the light could arrive from below in case the substrate were transparent to IR radiation and were covered by a transparent conductive oxide.

In the structure of FIG. 1, the radiation absorbed by the first layer $n^+$, called the window layer, may not be exploited since the layer is strongly doped and gives rise to fast recombination. Most of the radiation penetrates into the intermediate layer, and is in part absorbed as transition between valence band and defects.

The change of occupation in the intermediate layer produces a redistribution of the electric field in the structure. In particular, an increased number of trapped electrons increases the intensity of the electric field in the top part of the intermediate layer, the one next the doped layer $n^+$ (see FIG. 2). This corresponds to an increase in the structure capacitance.

Figure 3:
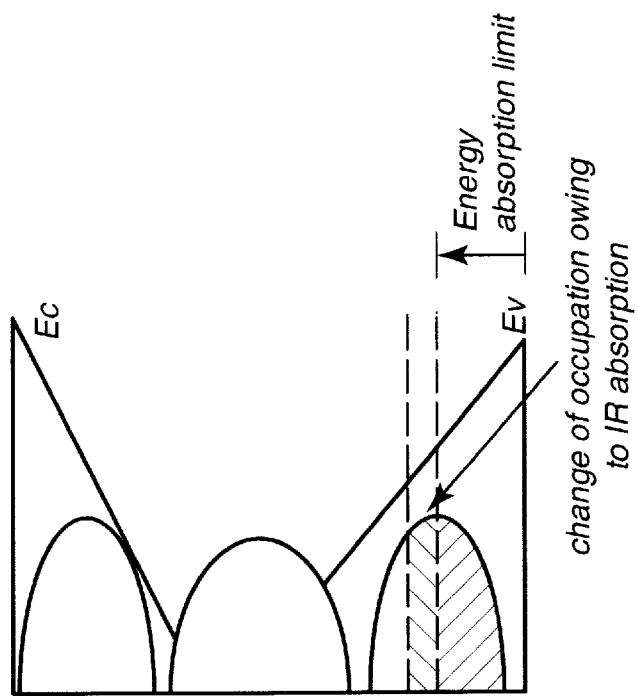
FIG. 3 is a diagram of the defect density in the forbidden gap and of their electron occupation in the intermediate semiconductor layer of the structure, with and without illumination.
Figure 3:
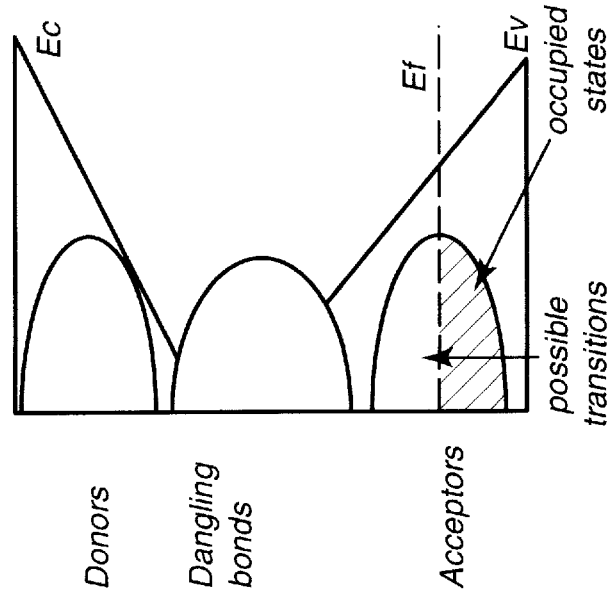

In order that the transition takes place, a defect not occupied by electrons has to exist. In the so-called step approximation this means that only the defects having an energy above the Fermi level (Ef) can accept the transition of an electron from the valence band, as is shown in FIG. 3. The distance of the Fermi level from the valence band determines then the minimum energy of the photons that can be absorbed and therefore the lower limit of the detector spectrum. For this reason a structure was chosen with the intermediate layer weakly p-doped, so that for a certain portion of the intermediate layer i the Fermi level will stay close to the valence band, reducing the energy necessary for the transition and extending the absorption spectrum. A microcompensated material will work just as well, and one such has displayed, through experiment, a p-type behavior if deposited on the inside of the structure starting from a strongly doped $p^+$ layer.

From what has been stated herein, it is possible to modulate, the absorption spectrum of the device, by changing the doping of the intermediate material i.

In the preferred embodiment, the optimum thickness of the intermediate layer found from experiment is around 1 $\mu$m. Greater depths give rise to a sensible slowing down of the reading times, even if they increase the amount of radiation absorbed and therefore the change in capacitance.

The presence of a large number of defects in the intermediate layer i blocks the possibility of obtaining photocurrent due to visible radiation (with energies higher than the gap's). In fact, photogenerated minority carriers are rapidly recombined owing to the high number of defects. Furthermore, in case of radiation with energy equal to or greater than one-half the gap energy, there are simultaneously found both transitions of electrons from the valence band towards defects and transitions from defects towards the conduction band. The presence at once of the two processes means that the accumulated charge is neutralized, thus reducing the effects of the visible radiation on the capacitance.

FIG. 4 shows the measurement scheme, using the instrumentation usually adopted for precision measurements of capacitance. A sine-wave voltage signal is applied to the structure, altering the free charge distribution. The capacitance is then proportional to the current in quadrature (out of phase by 90°) that penetrates into the structure. The trapping effect determines for the most part the capacitance of the structure and is increased by the absorption of IR light.

Figure 5:
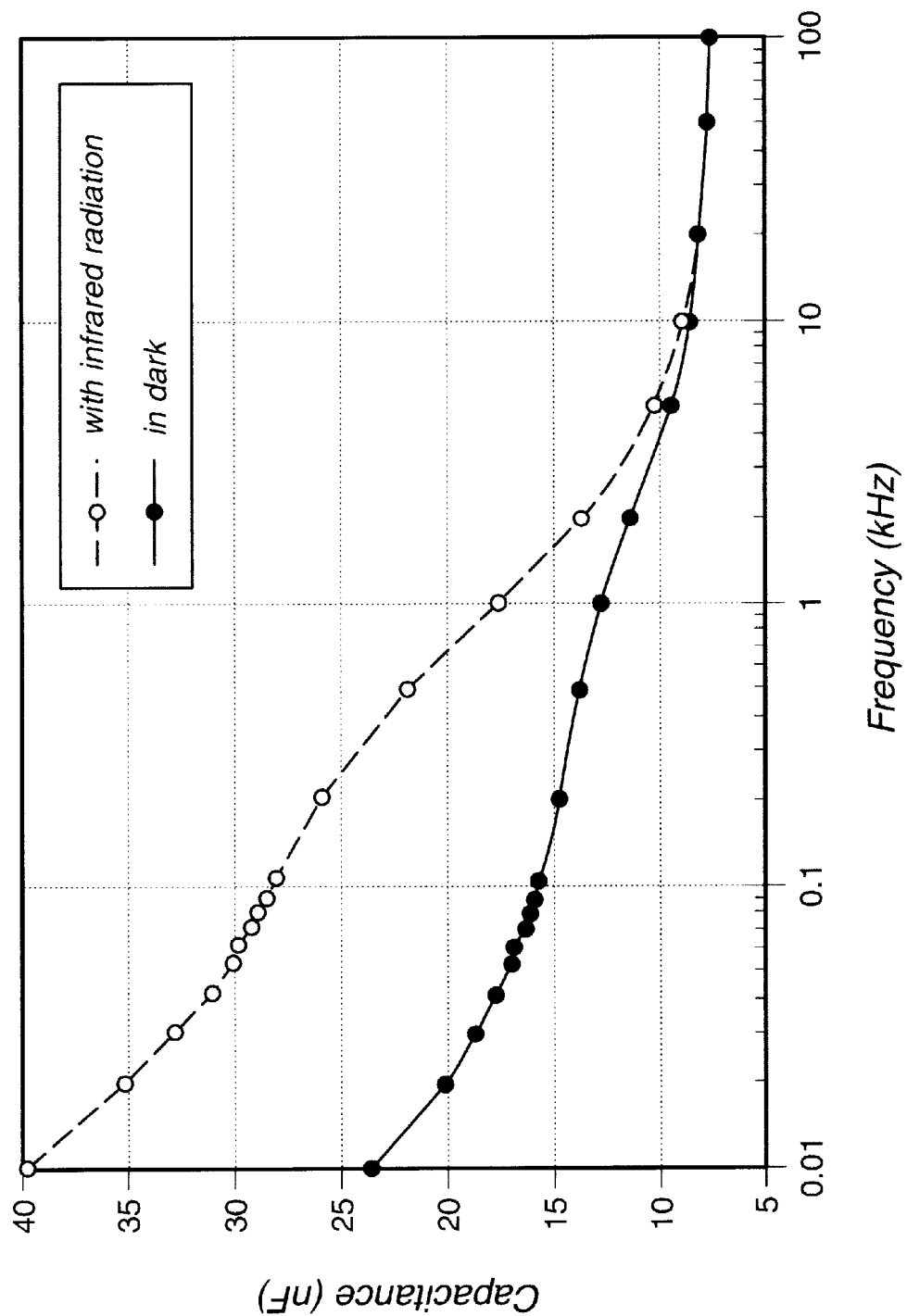
FIG. 5 is a schematic depiction of the capacitance expected at different frequencies with and without infrared radiation.

FIG. 5 shows the behavior of the capacitance expected at various frequencies, in the dark and under IR radiation. A sensible increase is noted in the capacitance where IR radiation is being absorbed, which makes the sensor suited to performing IR detection. To be noted also is a drop in the capacitance at high frequencies, since this capacitance is to a great extent due to trapping in defects, which requires the generation of heat and is therefore relatively slow. This detection process is therefore suited to constant or slowly varying radiations.

FIG. 6 shows an alternate scheme for the detection of rapidly varying light signals. In this case the capacitance is not measured directly, but rather what is measured is the current due to the charges alternately stored and released by the structure when its capacitance respectively increases or diminishes on the alternation of the intensity of the illuminating IR radiation. In this second scheme the charge generation process is stimulated by the absorption of the IR photon and is therefore intrinsically "fasts"; the acquisition process is therefore limited only by the component's parasite capacitance and possibly by the measurement system. This detection scheme is suited to demodulating signals on an IR optical carrier. In the case of measurements of very high sensitivity, the current measurement system should be of the coherent type, for example of the lock-in type, as shown for the detection of rapidly varying light signals in FIG. 6.

The deposition technique used to create the photodetector in question is the one already in use for the deposition of thin films of amorphous material. A preferred technique is called "Plasma-enhanced chemical vapour deposition (PECVD)", but other techniques too can be used to obtain materials suited to the invention. Amorphous material can be deposited on substrates of the glass type, of plastic, metal, ceramic, and may even be opaque, or even flexible, on which a film of conducting material has first been deposited. Furthermore, this technique makes possible its fabrication on any areas, even quite large ones, if the deposition machine is prepared for the purpose. Considering what has been said and making use of the techniques of photolithography in use, two-dimensional matrices of such photodetectors can be created of large area. The use of photolithography techniques can obtain high resolution for the individual pixel. And moreover, for a further increase in detection efficiency, an IR radiation-reflecting rear electrode can be used. In this case the unabsorbed radiation is reflected and crosses once again through the structure.

The IR-radiation-sensitive diode structure can be paired with a structure sensitive to visible radiation, which can always be built, using the same technique of amorphous silicon deposition, by the superposition of further layers, for example a further p-i-n cell having in this case an intermediate layer i that is not defect-laden but rather simply intrinsic. Suitable structures can be added to detect ultraviolet light.

What is claimed is:

1. An infrared detection system comprising:
    a first electrode;
    a second electrode;
    a superposed thin film layer structure connected between said first and second electrodes, said superposed thin film layer structure comprising:
        a p-type doped layer;
        a n-type doped layer;
        an intermediate layer sandwiched between said p-type doped layer and said n-type doped layer, said intermediate layer being of a material selected from the group consisting of compensated amorphous silicon and lightly doped amorphous silicon; and
    measurement means connected to said first and second electrodes, said measurement means for measuring a change of capacitance induced by radiation impinging on said superposed thin film layer structure.

2. The system of claim 1, further comprising:
    self-correlation means connected to said first and second electrodes for detecting current variations synchronous with variations in the radiation impinging on said superposed thin film layer structure.

3. The system of claim 1, said p-type doped layer and said n-type doped layer being formed of different materials, said different materials being of a type suitable for ensuring the change of capacitance by said intermediate layer under infrared radiation.

4. The system of claim 1, said p-type doped layer and said intermediate layer and said n-type doped layer being deposited upon each other.

5. The system of claim 1, further comprising:
    optical communication means connected to said measurement means for producing a visual image relative to the radiation impinging on said superposed thin film layer structure.

* * * * *